United States Patent
Blinn et al.

(10) Patent No.: US 9,430,450 B1
(45) Date of Patent: Aug. 30, 2016

(54) AUTOMATICALLY ADAPTING ACCESSIBILITY FEATURES IN A DEVICE USER INTERFACE

(71) Applicant: Sprint Communications Company L.P., Overland Park, KS (US)

(72) Inventors: Benjamin P. Blinn, Leawood, KS (US); Justin Eddings, Eudora, KS (US); Clyde Heppner, Liberty, MO (US); Harry Lai, Overland Park, KS (US); R. Brian Landers, Leawood, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 224 days.

(21) Appl. No.: 14/266,801

(22) Filed: Apr. 30, 2014

(51) Int. Cl.
| | | |
|---|---|---|
| *G06F 17/00* | (2006.01) |
| *G06F 17/21* | (2006.01) |
| *G06F 3/0488* | (2013.01) |
| *G06F 17/24* | (2006.01) |
| *G06K 15/02* | (2006.01) |
| *G06F 17/30* | (2006.01) |
| *G06F 3/0481* | (2013.01) |
| *G06F 17/22* | (2006.01) |
| *G06F 9/44* | (2006.01) |
| *G06F 17/25* | (2006.01) |
| *G06F 17/50* | (2006.01) |

(52) U.S. Cl.
CPC ........... *G06F 17/214* (2013.01); *G06F 3/0481* (2013.01); *G06F 3/0488* (2013.01); *G06F 9/443* (2013.01); *G06F 17/211* (2013.01); *G06F 17/2217* (2013.01); *G06F 17/24* (2013.01); *G06F 17/25* (2013.01); *G06F 17/30719* (2013.01); *G06F 17/30905* (2013.01); *G06F 17/50* (2013.01); *G06F 2201/81* (2013.01); *G06F 2201/86* (2013.01); *G06K 15/02* (2013.01); *H04M 2250/12* (2013.01)

(58) Field of Classification Search
CPC ........... G06F 17/214; G06F 17/30905; G06F 3/0482; G06F 3/0481; G06F 3/04842; G06F 9/4443; G06F 17/25; G06F 17/50; G06F 17/30719; G06F 9/443; G06F 2203/04806; G06F 2201/86; G06F 2201/81; H04M 1/72552; H04M 2250/12; H04M 1/72563; G06K 15/02
USPC ....... 715/269, 256, 273, 762, 800, 275, 744, 715/255; 709/206; 455/566
See application file for complete search history.

(56) References Cited

U.S. PATENT DOCUMENTS

| | | | |
|---|---|---|---|
| 2008/0074384 A1 | 3/2008 | Orr et al. | |
| 2010/0064248 A1* | 3/2010 | Lee | H04N 5/44513 715/781 |
| 2010/0299395 A1 | 11/2010 | Klassen | |
| 2012/0096344 A1 | 4/2012 | Ho et al. | |
| 2012/0327123 A1* | 12/2012 | Felt | G09G 5/00 345/600 |
| 2013/0254657 A1 | 9/2013 | Huang | |

* cited by examiner

Primary Examiner — Quoc A Tran

(57) ABSTRACT

A method of scaling font size on a user interface of a mobile communication device. The method comprises presenting a message in a first font size on a display of the mobile communication device, and after a predefined delay of time, presenting the message in a second font size on the display of the mobile communication device, where the second font size is larger than the first font size. The method further comprises receiving a selection of a font size and, based on the font size selection, determining and presenting an altered flow of screens and icons automatically in the user interface of the mobile communication device with the selected font size.

15 Claims, 5 Drawing Sheets

AUTOMATICALLY ADAPTING ACCESSIBILITY FEATURES IN A DEVICE USER INTERFACE

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Using mobile communication devices for purposes of reading the news or reading electronic mail and conducting business via a mobile communication device has become prevalent apart from the using the devices for wireless communication such as a phone call. Users may be able to browse the internet on a mobile communication device and conduct searches for information and read the relevant information presented by the searches. Users of mobile communication devices may be able to manually configure the settings of the font and the font size in which the material is presented on the mobile communication device, for example by navigating a graphical user interface menu tree. The process for setting of font size may be different for different devices and the user may learn the method for configuring the font sizes by either experimenting with the configuration settings or reading a manual that is available with the device.

SUMMARY

In an embodiment, a method of scaling font size on a user interface of a mobile communication device is disclosed. The method comprises presenting a message in a first font size on a display of the mobile communication device, and, after a predefined delay of time, presenting the message in a second font size on the display of the mobile communication device, where the second font size is larger than the first font size. The method further comprises receiving a selection of a font size and, based on the font size selection, determining an altered flow of screens and icons automatically in the user interface of the mobile communication device based on the selected font size. The method further comprises presenting the altered flow of screens and icons in the user interface of the mobile communication device with the selected font size.

In an embodiment, a mobile communication device is disclosed. The mobile communication device comprises a processor, a display, a memory, and an application stored in the memory. When executed by the processor during activation of the mobile communication device, the application presents a message in a first font size on the display and, after a pre-defined delay of time, presents the message in a second font size in the display, where the second font size is larger than the first font size. The application also receives a selection of a font size and, based on the selection of the font size, determines an altered flow of screens and icons based on the selected font size, and presents the altered flow of screens and icons and the selected font size on the display.

In an embodiment, a mobile communication device is disclosed. The device comprises a processor, a memory, a display, a proximity sensor, a camera, and an application stored in the memory. When executed by the processor, after initial configuration of the mobile communication device, the application resizes a standard font to a larger size than the current font size based on one of a proximity of a user to the mobile communication device, a detection of squinting of the eye of the user by the camera, or a triangulation between focus of the eye of the user, the camera and the proximity sensor. The standard font is used to scale text fonts presented on the display.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
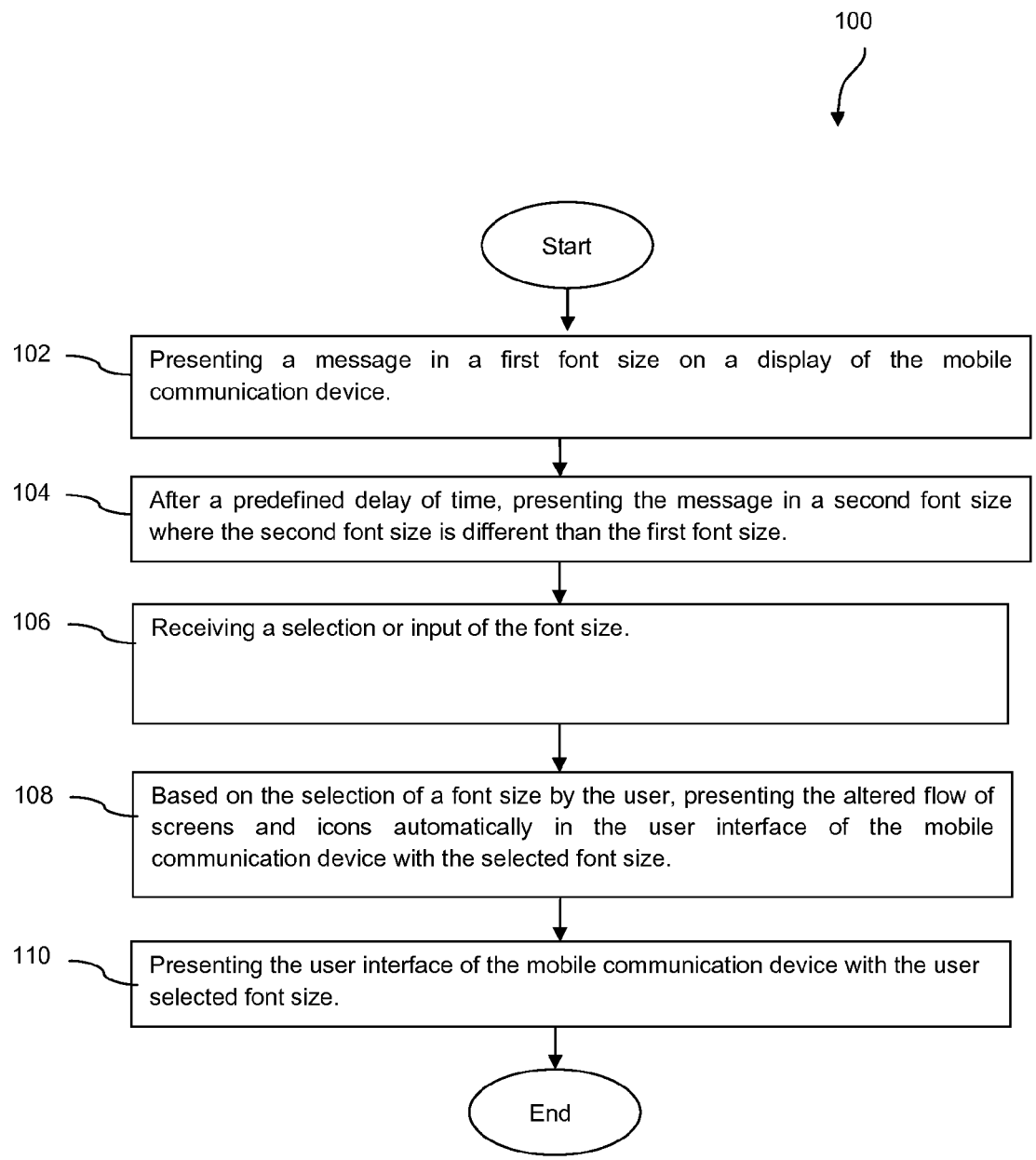
FIG. 1 is a flow chart illustrating a method according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Mobile communication devices are replete with applications that enable a user to perform multiple functions such as sending and receiving electronic mail, reading books or looking for information using an internet browser on the mobile communication device. These applications may be accessible on the mobile communication device by navigating through touch screens which form the user interface of the device and invoking an application that may be represented as icons with text below icons indicating the name or function of the application. The user of a mobile communication device may adjust the settings of their device, for example volume of the phone, vibration settings for various applications on the device, brightness of the display, and the standard font size. Such adjustments may improve the device's accessibility.

These accessibility settings may be configurable by the user according to the needs of the user. One such setting is the font size the device uses to present text, for example, icons representing applications with text below to identify the application, text in which a browser displays context, text that is sent or received while using the Short Messaging Service (SMS) and the like. In some contexts, the adjustment of the accessibility settings may be referred to as adapting or adjusting the amplitude of the accessibility settings. For example, the font size may be considered to be an amplitude of the font—a bigger font is a font having a larger amplitude, a smaller font is a font having a smaller amplitude. The volume of a speaker, the vigor of a vibrator, the brightness of a display, likewise, may be considered to be amplitudes of their respective output devices.

Activation of a mobile communication device may be performed when the mobile communication device is purchased in a retail store or may be completed by the user after the first time the device is powered on. The device turns on and initiates communication with a network and through a sequence of messages with a server, sets up the device capabilities, the application configuration and the user experience of the device. The user may also select preferences or settings during the activation process. The font size setting may be configured after the user has activated the mobile communication device. A default font size may be pre-configured or installed during activation and users can later adjust the font size to meet their own personal preferences. The method of setting the font size may be different on different mobile communication devices, and the user may not know how to set the font size. The user may need to read the manual of the mobile communication device and/or find the setting in a menu tree in order to change the font size setting or another accessibility setting. Often users may simply accept the default font size, though he or she may not prefer that default font size, just to avoid the hassle of reading the manual or hunting through the menu trees to find the setting control. This may result in a lower user accessibility to the device than if a preferred font size were selected by the user.

This disclosure teaches a system that prompts and aids the user to set the font and/or other accessibility settings of his or her mobile communication device during activation. In an embodiment, during the activation and/or the initial configuration of the mobile communication device, the font size may be set up for a user's need by displaying a message, for example, "Are you able to easily read this message? If yes, confirm." with a font size, for example font size 5. If the user is unable to read the message, after a short delay, a similar message is displayed to the reader in the next higher font size, for example font size 8. If the user does not confirm that they are able to read the message with a font size of 8, after a short interval, the message is again displayed with the next higher font size, for example, font size 10. This sequence of displaying the message repeats for a few more cycles with the next higher font size and when there is no confirmation from the user, the message with the first font size of 5 is again displayed. The number of cycles that the message is repeated in varying font sizes may be a pre-determined number or may be customized depending on the type of the mobile communication device. Once the confirmation is received from the user for a particular font size, the font size is saved to a configuration file in the mobile communication device. The user selection of a font size may also trigger the readjustment of display of icons and related applications to adopt the selected font size on a device that supports multiple screens with application icons. The icons may be scaled larger or smaller depending on the font size selected. For example, if a user prefers a large font size, perhaps because the user has poor vision, the device may assume the user also prefers larger icons and may scale icons proportionally larger. In some cases, where the font size may be large, the device may automatically change the representation of applications from icons to a list view of applications with a scroll bar for easy use.

In other embodiments, other approaches may be used. Rather than starting small and getting larger, the font may start large and successively get smaller. The message may read "Can you still read this? When the user stops confirming, the next largest fond size is deemed the smallest that can still be read and may be used as the standard font size. The accessibility adaptation application may propose a first font and a second font side-by-side at the same time and ask which font the user prefers. It the user selects the larger font, then that font and the next larger font are shown side-by-side. If the user selects the bigger font, again the next bigger font is displayed. If the user selects any font size twice in a row, that is deemed the standard font.

Alternatively, the accessibility application could rapidly alternate between presentation of a first font size and a second font size and ask user which size is preferred, a font A or a font B (selecting by pressing a letter, for example). Again, a different combination of font sizes may be presented successively. When the user selects the same font size twice, that font is deemed selected.

In an embodiment, after a font size is selected, the accessibility application may present exemplary content, such as a portion of a dictionary, to provide a full-screen example of use of the font. The exemplary content page would provide a control for returning to the font size selection process to revise the selection if desired. This may be referred to as illustrating the impact of the font size selection. In an embodiment, the accessibility application may also present a view of how the icon layout would look or how a standard icon layout would look given the font size selection. Thus, if a user thinks they prefer a bigger font size that would cause their icons to be displayed instead as list entries, which the user may strongly dislike, the font size may readily be redetermined.

It is understood that displays associated with different functions and/or applications on the mobile communication device may contain elements that use different font sizes. It is understood that the user selected font size may be used as a scaling standard to adapt font sizes of other portions and/or elements of displays. For example, an email application may use the standard font to represent a sender of an email in an in-box of the email application display and use a font that is 75% of the size of the standard font to represent the subject of the email when displaying a list of received emails. A notification such as a battery low condition notification may be presented using a font that is 125% of the size of the standard font. Said in other words, the display of applications or messages for a user on a mobile communication device may have fonts that are a different font style from the selected standard font size. These applications or messages may be rendered in a display of mobile communication device with a larger or smaller font size in relation to the font size of the saved font in the configuration file but the proportional relationships between the fonts may be preserved. For example, given a standard font associated proportionally to a Font A and Font B, let us say that Font A is bigger than the standard font and Font B is smaller than the standard font. These fonts are displayed in unison in the display of the mobile communication device. If a first user, for example, selects a standard font size 10, Font A automatically scales to a font size 12 and Font B to a font size 8. A second user may select the standard font size to be a font size 8 and Font A automatically scales to a font size 10 and Font B to a font size 6. There may be more than three proportionally related fonts with different font styles but the fonts and font styles automatically scale in unison when a user selects a standard font size. It is understood that the specific font sizes and amounts of scaling stated above are exemplary and other scalings and font sizes are contemplated by the disclosure.

The confirmation of the font size may depend on the type of mobile communication device. If the device is a smart phone, the confirmation may be performed by double tapping the user interface which may be a touch screen on the device. There may be an input key for devices without touch screens in order to confirm the font size.

In an embodiment, during the initial configuration of the mobile communication device, the user may be prompted with a message if he or she is able to read a particular message in a certain font size. Once the confirmation is received from the user that they are able to read the message, different choices of the resultant display of applications may be provided to the user. The user would then be able to select a choice of the resultant display and the selected font size is then stored to a configuration file in the memory of the mobile communication device. It is understood that the memory where the configuration file is stored may be file memory or internal memory of the mobile communication device.

In an embodiment, the message "Are you able to read this message easily? If yes, confirm" may be presented or played over a speaker, using recorded voice messages, depending on the capability of the mobile communication device. This functionality may the attention of the user, for example when the user may be looking away from the display, reading a user guide or manual.

The same approach may be used for other accessibility settings such as speaker audio volume, ear phone volume, display brightness, vibration settings for various applications and the like. A proximity sensor is a device, available in many mobile communication devices, that senses the proximity of a user's face to the mobile communication device. One common use of a proximity sensor is to disable the touch screens of mobile communication device when a user holds the mobile communication device close to their ear in order to make a phone call. In an embodiment, when the user of the mobile communication device squints at the device or brings the device closer to their face or focuses the eye at a specific area of the user interface on a mobile communication device, it may be possible using the proximity sensor and a camera to detect the area of the phone that the user is viewing. If it is determined that the user is squinting or holding the mobile communication device closer to the face, the inference may be made that the font is too small, and the application stored in the memory can then increase the font size of the area that the user is looking at. There may be no readjustment of other displays on the phone, and the font scale adaptation may be a temporary so that the font scaling reverts to the previously used font scale after a pre-defined period of time, for example after 20 seconds or after 60 seconds or after 2 minutes or after 5 minutes. This approach may also be used to adjust the brightness or contrast of the screen on a mobile communication device based on the distance of the user's face to the mobile communication device as detected by the camera or the proximity sensor.

In another embodiment, the application may track the number of times a user squints and/or brings the mobile communication device closer to the eye and may trigger a message to change the font size of the application after a pre-determined number of times. This may then be stored in the configuration file in the memory of the mobile communication device. It is understood that the memory where the configuration file is stored may be file memory or internal memory of the mobile communication device.

In another embodiment, the area where the user is viewing may be highlighted and similar word patterns in the text may be highlighted for the user instead of increasing the font size. It may also be possible to scroll the display further to the left, right, up or down depending on where the user is viewing. This may be comparable to using the eye to navigate the screen instead of touch. For example, if the user is reading a book on the device, when the user looks down, the off screen contents or the lower portion of a page or the next page may move upwards to appear in about the middle of the screen for the user to read. If the user looks up, the off screen contents or the upper portion of the page may move downwards to appear in about the middle of the screen for the user to read. Said in other words, by looking upwards or downwards with his or her eyes, the reader may provide an input to the mobile communication device to control a content scrolling function.

In an embodiment, analytics may be performed and a correlation between the font size and the volume setting may be studied and automatically adjusted. For example, the user of the device who prefers larger fonts may prefer a louder audio volume. These analytics may be stored in the configuration table mapped for a particular font size. When the user selects a font size, the application may read the corresponding values for other accessibility settings, in this example, louder audio volume, and adjust automatically.

While the description of new methods for configuring accessibility settings discusses triggering, at least in some embodiments, based on activation, it is understood that the present disclosure also teaches employing these methods during other circumstances. For example, in an embodiment, the user may invoke an accessibility configuration session at any time, and the time sequenced presentation of different intensities or amplitudes of the outputs of the different output devices can be executed. It may be that a pattern of eye movement or eye usage (squinting, hunting motion) may be used to trigger activation of an application supporting selection of accessibility configuration settings, for example font size setting selection.

Turning now to FIG. 1, a method 100 is described. At block 102, the method 100 presents a message in a first font size in a display of the mobile communication device. The user of the mobile communication device upon activation is presented with a message "Are you able to read this message easily?" in a first font size, for example in 5 point font. At block 104, after a predefined delay in time, the message is presented in a second font size where the second font size is larger than the first font size. Alternatively, the message may be presented in a second font size that is smaller than the first font size. The user is now presented with the same message "Are you able to read this message easily?" in a second font size, for example in 8 point font, after about 2 seconds. At block 106, a selection or input of the font size is received, and at block 108, based on the selection of a font size by the user, the flow of screens and icons is automatically redetermined and the presentation on the display of the mobile communication device is accordingly redrawn. This may be referred to in some contexts as reflowing the screen of the mobile communication device. Reflowing the screen not only comprises changing the font size of text in the display but may also comprise moving the location of icons, changing the relative positions of icons, or changing from showing applications as icons to showing applications as lists.

Additionally, after the user has selected a font size, the display of icons may be altered where originally, if the number of icons displayed icons in a screen was 6, it may now be 4 after a font size was selected. This also may result in the adjustment of icons in one or more of the screens. At block 110, present the user interface of the mobile communication device with the user selected font size and possibly reflowed screens. Finally, the user selected font size is displayed. Also as discussed above, different font size and font styles are adapted based on the selected font and automatic scaling of fonts proportional to the selected font may be seen in the display of the mobile communication device. For example, a selection of a size of a standard font may control the selection of related fonts, for example a larger font for displaying headlines or important messages and a smaller font for displaying trivial details.

Figure 2:
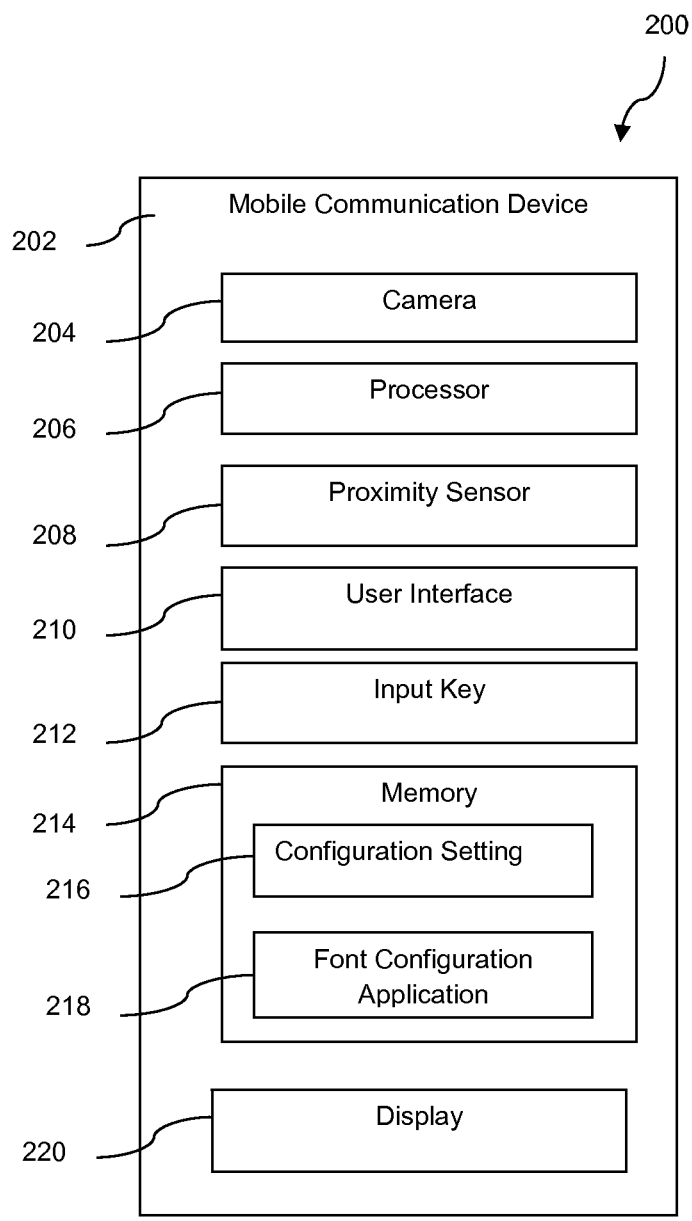
FIG. 2 is an illustration of a communication system according to an embodiment of disclosure.

Turning now to FIG. 2, a communication system 200 is described. The communication system 200 comprises a mobile communication device 202, a camera 204, a processor 206, a proximity sensor 208, a touch screen display 220, an input key 212, a memory 214. The memory 214 comprises a configuration setting data store 216 and a font configuration application 218. The font configuration application 218 when executed by the processor 206, during the initial configuration and/or activation of the mobile communication device 202, presents a message to the user with an initial font size. This message may be for example, "Are you able to easily read this message? If yes, confirm." in a 5 point font. The user may confirm using the touch screen display 210 or by means of an input key 212. If there is no response from the user, the font configuration application 218, presents the same message in the next larger font size after a predefined delay. The delay may be about 2 seconds or about 3 seconds or about 5 seconds or about 10 seconds. For example, the font size may be 8 point font for the same message that was previously displayed in 5 point font. The user if unable to read the message easily may not confirm and the font configuration application 218, after a predefined delay interval, may display the previously stated message in the next larger font size, for example, a 10 point font. If the user does not confirm the messages displayed, after 5 different font sizes are displayed, the font configuration application 218 displays the message in the first font size that was displayed at the start of the font size set up, in this example, 5 point font and repeats the sequence. Also, as described above, the selection of a standard font proportionally changes the other font sizes in the display of the device and the font styles are preserved.

When the user confirms that they are able to read the message, the font configuration application 218 displays the resultant changes in screens and icons to the user and confirms that the user wants to save the selection of font size. For example, if before the selection, the number of icons in a screen was 6, after the selection of a font size, the number of icons may need to be 4 in the first screen. Additional changes in the screens following the first screens and the number of icons per screen may be adjusted as a result of the font change. If the user confirms the selection of the font size based on the changes in screens and icons, the font configuration application 218 may store that selected font size in the configuration setting data store 216 in the memory 214 of the mobile communication device 202. The configuration setting data store 216 may be stored in internal memory or file memory of the device 202. The resultant display of icons are scaled larger or smaller in relation to the font size selected. It may be possible that the icons may become too large and may need to be arranged as a list view of applications with a scroll bar.

If the user does not confirm the selection of the font size based on the resultant changes in screens and icons, the message to read and confirm in the next font size is displayed. It is understood that the first font size is the smallest font size and the cycle of 5 messages are then displayed in incrementally larger font size than the first. It is also understood that the cycle of messages may be more or less than 5 messages displayed.

In an embodiment, the font configuration application 218 may display the message to confirm that the user of the mobile communication device 202 is able to read in an initial font size and when confirmation is received, saves the font size selection into the configuration setting data store 216. The font configuration application 218 then changes the display of screens and icons.

In another embodiment, the font configuration application 218 may perform analytics and store the analytics on the correlation of the font size setting and other settings such as the speaker audio of the mobile communication device 202. The font configuration application may store the analytics in the configuration setting data store 216 as a mapping of a font size to the speaker audio, for example in a mapping table or other structure, and when the user changes to a font size available in the mapping table, may adjust the speaker audio according to the stored value in the mapping table.

The proximity sensor 208 may detect the proximity of a user's face to the screen of the mobile communication device 202. The camera 204 may detect the squint on a user's face. Based on triangulation between the proximity sensor and the camera, it may be possible to detect the focus of the user's eye on the mobile communication device 202. With the trigger events like proximity increase of the user's face to the mobile communication device 202 or the squinting on focus of the eye on a particular area in the user interface of the mobile communication device 202, the font configuration application may increase the font size for 5 seconds in the area where the user is viewing and reverts back the font size to the previously displayed size. The enlarged font size is temporary and is not saved in the configuration setting data store 216. The normal range that a user holds a mobile communication device 202 is about 16 inches away from a user's face. If the user squints or brings the mobile communication device 202 closer to the face than the normal range, the proximity sensor 208 may sense that the mobile communication device 202 is close and increase the font size to be larger than the current font size. When the user takes the mobile communication device 202 further away than the normal range, which is more than 16 inches, the proximity sensor 208 detects this range and may reduce the font size to be smaller than the current font size.

The mobile communication device 202 may be a mobile phone, a media player, a personal digital assistant (PDA), a wireless communication enabled laptop computer, a wireless communication enabled tablet computer, or a wireless communication enabled notebook computer. The present disclosure may be enabled on any of the above devices.

Figure 3:
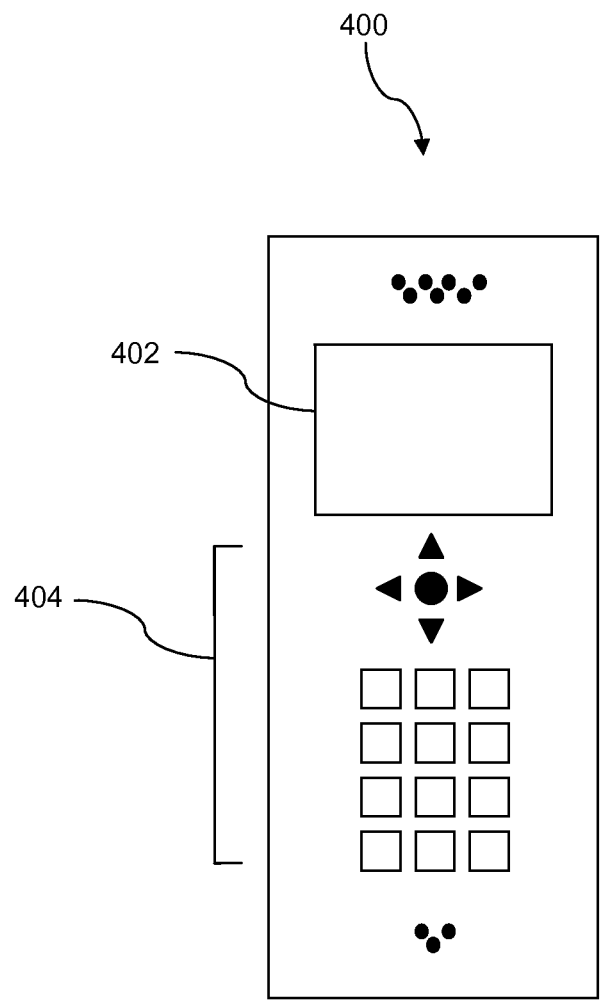
FIG. 3 is an illustration of a mobile communication device according to an embodiment of the disclosure.

FIG. 3 shows a wireless communications system including the mobile device 400. FIG. 3 depicts the mobile device 400, which is operable for implementing aspects of the present disclosure, but the present disclosure should not be limited to these implementations. Though illustrated as a mobile phone, the mobile device 400 may take various forms including a wireless handset, a pager, a personal digital assistant (PDA), a gaming device, or a media player. The mobile communication device 400 includes a display 402 and a touch-sensitive surface and/or keys 404 for input by a user. The mobile device 400 may present options for the user to select, controls for the user to actuate, and/or cursors or other indicators for the user to direct. The mobile communication device 400 may further accept data entry from the user, including numbers to dial or various parameter values for configuring the operation of the handset. The mobile device 400 may further execute one or more software or firmware applications in response to user commands. These applications may configure the mobile device 400 to perform various customized functions in response to user interaction. Additionally, the mobile device 400 may be programmed and/or configured over-the-air, for example from a wireless base station, a wireless access point, or a peer mobile device 400. The mobile device 400 may execute a web browser application which enables the display 402 to show a web page. The web page may be obtained via wireless communications with a base transceiver station, a wireless network access node, a peer mobile device 400 or any other wireless communication network or system.

Figure 4:
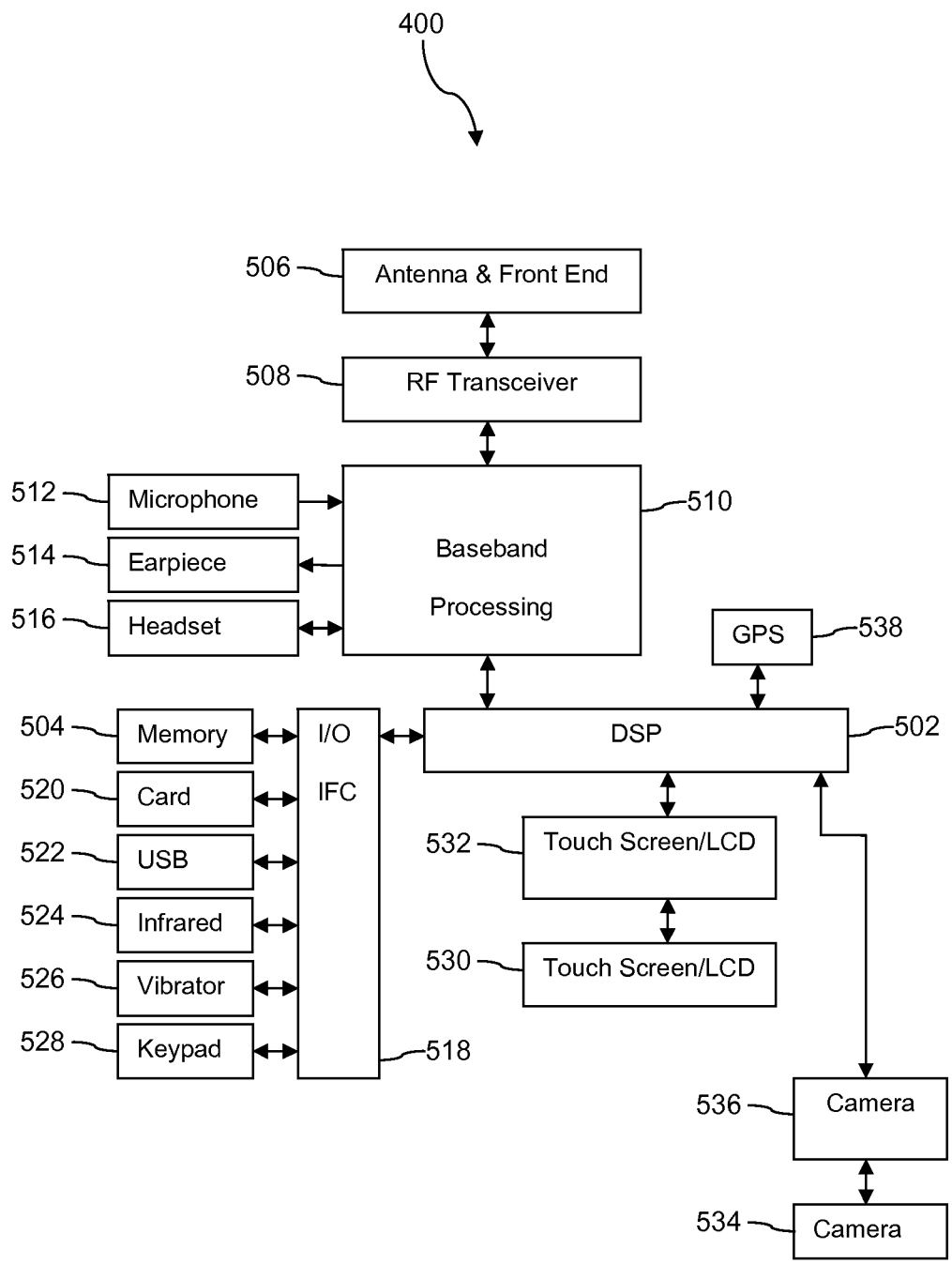
FIG. 4 is a block diagram of a mobile communication device according to an embodiment of the disclosure.

FIG. 4 shows a block diagram of the mobile device 400. While a variety of known components of handsets are depicted, in an embodiment a subset of the listed components and/or additional components not listed may be included in the mobile device 400. The mobile device 400 includes a digital signal processor (DSP) 502 and a memory 504. In an embodiment, the memory 504 has a system partition, a carrier partition, and a user partition, wherein an operating system of the mobile device 400 restricts write access to system partition based on an original equipment manufacturer (OEM) access password and restricts write access to the carrier partition based on a wireless communication service carrier access password.

As shown, the mobile device 400 may further include an antenna and front end unit 506, a radio frequency (RF) transceiver 508, a baseband processing unit 510, a microphone 512, an earpiece speaker 514, a headset port 516, an input/output interface 518, a removable memory card 520, a universal serial bus (USB) port 522, an infrared port 524, a vibrator 526, a keypad 528, a touch screen liquid crystal display (LCD) with a touch sensitive surface 530, a touch screen/LCD controller 532, a camera 534, a camera controller 536, and a global positioning system (GPS) receiver 538. In an embodiment, the mobile device 400 may include another kind of display that does not provide a touch sensitive screen. In an embodiment, the DSP 502 may communicate directly with the memory 504 without passing through the input/output interface 518. Additionally, in an embodiment, the mobile device 400 may comprise other peripheral devices that provide other functionality.

The DSP 502 or some other form of controller or central processing unit operates to control the various components of the mobile device 400 in accordance with embedded software or firmware stored in memory 504 or stored in memory contained within the DSP 502 itself. In addition to the embedded software or firmware, the DSP 502 may execute other applications stored in the memory 504 or made available via information carrier media such as portable data storage media like the removable memory card 520 or via wired or wireless network communications. The application software may comprise a compiled set of machine-readable instructions that configure the DSP 502 to provide the desired functionality, or the application software may be high-level software instructions to be processed by an interpreter or compiler to indirectly configure the DSP 502.

The DSP 502 may communicate with a wireless network via the analog baseband processing unit 510. In some embodiments, the communication may provide Internet connectivity, enabling a user to gain access to content on the Internet and to send and receive e-mail or text messages. The input/output interface 518 interconnects the DSP 502 and various memories and interfaces. The memory 504 and the removable memory card 520 may provide software and data to configure the operation of the DSP 502. Among the interfaces may be the USB port 522 and the infrared port 524. The USB port 522 may enable the mobile device 400 to function as a peripheral device to exchange information with a personal computer or other computer system. The infrared port 524 and other optional ports such as a Bluetooth® interface or an IEEE 802.11 compliant wireless interface may enable the mobile device 400 to communicate wirelessly with other nearby handsets and/or wireless base stations.

The keypad 528 couples to the DSP 502 via the interface 518 to provide one mechanism for the user to make selections, enter information, and otherwise provide input to the mobile device 400. Another input mechanism may be the touch screen LCD 530, which may also display text and/or graphics to the user. The touch screen LCD controller 532 couples the DSP 502 to the touch screen LCD 530. The GPS receiver 538 is coupled to the DSP 502 to decode global positioning system signals, thereby enabling the mobile device 400 to determine its position.

Figure 5A:
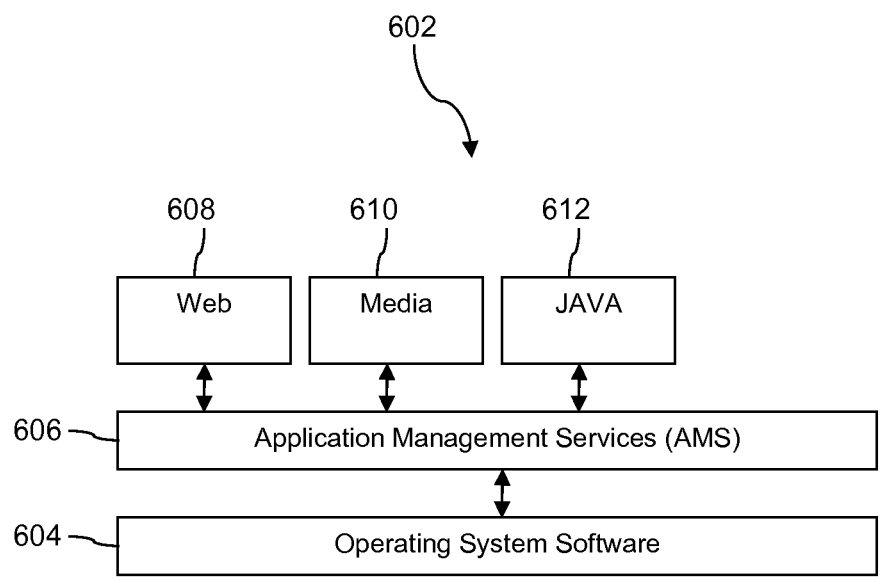
FIG. 5A is a block diagram of a software architecture of a mobile communication device according to an embodiment of the disclosure.

FIG. 5A illustrates a software environment 602 that may be implemented by the DSP 502. The DSP 502 executes operating system software 604 that provides a platform from which the rest of the software operates. The operating system software 604 may provide a variety of drivers for the handset hardware with standardized interfaces that are accessible to application software. The operating system software 604 may be coupled to and interact with application management services (AMS) 606 that transfer control between applications running on the mobile device 400. Also shown in FIG. 6A are a web browser application 608, a media player application 610, JAVA applets 612. The web browser application 608 may be executed by the mobile device 400 to browse content and/or the Internet, for example when the mobile device 400 is coupled to a network via a wireless link. The web browser application 608 may permit a user to enter information into forms and select links to retrieve and view web pages. The media player application 610 may be executed by the mobile device 400 to play audio or audiovisual media. The JAVA applets 612 may be executed by the mobile device 400 to provide a variety of functionality including games, utilities, and other functionality. The guardian mobile application 106 is described above.

Figure 5B:
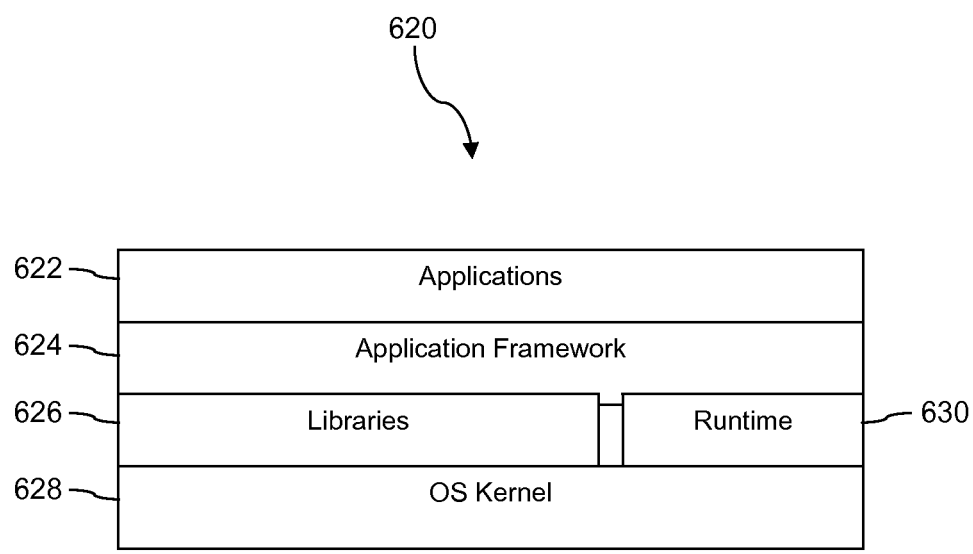
FIG. 5B is a block diagram of another software architecture of a mobile communication device according to an embodiment of a disclosure.

FIG. 5B illustrates an alternative software environment 620 that may be implemented by the DSP 502. The DSP 502 executes operating system software 628 and an execution runtime 630. The DSP 502 executes applications 622 that may execute in the execution runtime 630 and may rely upon services provided by the application framework 624. Applications 622 and the application framework 624 may rely upon functionality provided via the libraries 626.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method of scaling font size on a user interface of a mobile communication device comprising:
   during initial activation of the mobile communication device:
      presenting a message in a first font size on a display of the mobile communication device, wherein the mobile communication device comprises a user interface with an initial flow of screens and icons;
      after a predefined delay of time, presenting the message in a second font size on the display of the mobile communication device, where the second font size is larger than the first font size;
      receiving a selection of a standard font size based on the display of the message in the first font size and the display of the message in the second font size after the predefined delay of time;
      determining a different flow of screens and icons automatically in the user interface of the mobile communication device based on the selected standard font size, wherein the different flow of screens and icons comprises a different placement of the icons in the screens on the user interface;
      presenting the different flow of screens and icons in the user interface of the mobile communication device with the selected standard font size; and
      in response to selection of the standard font size, proportionally changing other fonts and font sizes in the display such that the proportional relationships between the fonts and the font sizes are preserved.

2. The method of claim 1, further comprising presenting the message in a third font size, wherein the third font size is bigger than the second font size.

3. The method of claim 2, further comprising presenting the message in a fourth font size, wherein the fourth font size is bigger than the third font size.

4. The method of claim 1, further comprising displaying, in response to a determination that no selection of a font size has been received and after a sequence of a plurality of larger font sizes are presented, the message in the first font size.

5. The mobile communication device of claim 1, wherein the predefined delay of time between the display of the first font size and the second font size is at least two seconds.

6. The method of claim 1, wherein the different placement of the icons in the screens on the user interface comprises at least one of moving a location of one or more of the icons, changing a relative position of one or more of the icons, or changing to a list view of applications in the user interface.

7. A mobile communication device, comprising:
   a processor;
   a display;
   a user interface, wherein the user interface comprises an initial placement of icons in screens accessible through the user interface;
   a memory; and
   an application stored in the memory that when executed by the processor, during initial activation of the mobile communication device:
      presents a message in a first font size on the display;
      after a pre-defined delay of time, presents the message in a second font size in the display, where the second font size is different than the first font size;
      re-presents the message in the first font size on the display in response to a determination that no selection of a font size has been received and after a sequence of a plurality of larger font sizes are presented;
      receives a selection of a standard font size based on the display of the message in the first font size and the display of the message in the second font size after the predefined delay of time;
      based on the selection of the standard font size, determines a different placement of icons in screens accessible through the user interface; and
      presents the different placement of the icons in the screens on the user interface.

8. The mobile communication device of claim 7, wherein the mobile communication device is one of a mobile phone, a media player, a personal digital assistant (PDA), and a wireless communication enabled laptop computer, a wireless communication enabled tablet computer, and a wireless communication enabled notebook computer.

9. The mobile communication device of claim 7, wherein the selected standard font size is saved to the configuration setting in internal memory or file memory of the mobile communication device.

10. The mobile communication device of claim 7, wherein the configuration setting saved to the internal memory or the file memory of the mobile communication device consists of one saved font size.

11. The mobile communication device of claim 7, wherein the application is configured to display a next larger font size than a previously displayed font size based on a time interval when a font size is not selected.

12. The mobile communication device of claim 7, wherein the different placement of the icons in the screens comprises a list view of applications in the user interface of the mobile communication device.

13. The mobile communication device of claim 7, wherein the message in the first font size is displayed again after a sequence of five font sizes are presented and no selection of a font size is received.

14. The mobile communication device of claim 7, wherein the pre-defined delay of time between the displaying of the first font size and the second font size is at least three seconds.

15. The mobile communication device of claim 7, wherein the first font size is smaller than all subsequently displayed font sizes.

\* \* \* \* \*